(12) United States Patent
Hur et al.

(10) Patent No.: US 10,095,283 B2
(45) Date of Patent: Oct. 9, 2018

(54) HARDWARE SHIELD DEVICE AND ELECTRONIC DEVICES INCLUDING THE SAME

(71) Applicant: Samsung Electronics Co., Ltd., Suwon-si, Gyeonggi-do (KR)

(72) Inventors: Jun Hur, Suwon-si (KR); Seung Ki Choi, Hwaseong-si (KR); Seung Bum Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 14/628,494

(22) Filed: Feb. 23, 2015

(65) Prior Publication Data
US 2015/0241936 A1 Aug. 27, 2015

Related U.S. Application Data

(60) Provisional application No. 61/944,055, filed on Feb. 24, 2014.

(30) Foreign Application Priority Data

Oct. 15, 2014 (KR) ........................ 10-2014-0139284

(51) Int. Cl.
*G06F 1/20* (2006.01)
*H05K 9/00* (2006.01)
(Continued)

(52) U.S. Cl.
CPC ............ *G06F 1/203* (2013.01); *G06F 1/1656* (2013.01); *H01L 23/367* (2013.01);
(Continued)

(58) Field of Classification Search
CPC ....... H01L 23/3672; G06F 1/20; H04B 1/036; H05K 7/2039; H05K 7/20409;
(Continued)

(56) References Cited

U.S. PATENT DOCUMENTS 6,377,472 B1 * 4/2002 Fan ...................... H05K 9/0032
174/379
6,487,073 B2 11/2002 McCullough et al.
(Continued)

FOREIGN PATENT DOCUMENTS

KR 10-1229058 B1 2/2013

OTHER PUBLICATIONS

European Office Action dated Apr. 26, 2018, issued in the European Application No. 15156252.7.

*Primary Examiner* — Robert J Hoffberg
*Assistant Examiner* — Hung Dang
(74) *Attorney, Agent, or Firm* — Jefferson IP Law, LLP

(57) ABSTRACT

A hardware shield device and an electronic device are provided. The device and electronic device include a shield can including an opening through which at least a part of a device element is exposed, a heat dissipation module including at least a part that is mounted on the opening, a cover member connected to one surface of the heat dissipation module, and a conductor arranged between the shield can and the cover member, the conductor surrounding both the opening and at least a part of a periphery of the heat dissipation module.

20 Claims, 10 Drawing Sheets

(51) Int. Cl.
*H01L 23/467* (2006.01)
*H05K 7/20* (2006.01)
*H05K 1/02* (2006.01)
*H01L 23/367* (2006.01)
*G06F 1/16* (2006.01)

(52) U.S. Cl.
CPC ......... *H05K 1/0203* (2013.01); *H05K 7/2039* (2013.01); *H05K 9/0024* (2013.01)

(58) Field of Classification Search
CPC .. H05K 1/0203; H05K 9/0007; H05K 9/0009; H05K 9/0015
See application file for complete search history.

(56) References Cited

U.S. PATENT DOCUMENTS

| | | | | |
|---|---|---|---|---|
| 6,673,998 B1* | 1/2004 | Wu | ........................ | H05K 7/2049 174/383 |
| 6,744,640 B2* | 6/2004 | Reis | ....................... | H01L 23/552 174/383 |
| 7,061,773 B2* | 6/2006 | Chen | .................... | H05K 9/0039 361/800 |
| 7,265,984 B2* | 9/2007 | Numata | ............... | H05K 7/2049 165/104.33 |
| 7,286,360 B2 | 10/2007 | Sohn | | |
| 7,312,998 B2* | 12/2007 | Kamemoto | ........... | H05K 7/2049 165/185 |
| 7,463,496 B2* | 12/2008 | Robinson | ............... | H01L 23/552 361/816 |
| 7,488,902 B2* | 2/2009 | English | ................ | H05K 9/0032 174/377 |
| 7,623,360 B2* | 11/2009 | English | ................ | H05K 9/0032 361/800 |
| 7,952,881 B2 | 5/2011 | Magana et al. | | |
| 8,385,070 B2* | 2/2013 | Huang | .................... | G06F 1/203 165/80.2 |
| 8,952,272 B2* | 2/2015 | Malek | .................. | H05K 9/0032 174/382 |
| 9,165,854 B2* | 10/2015 | Chun | .................. | H01L 23/3672 |
| 2002/0064024 A1 | 5/2002 | McCullough et al. | | |
| 2003/0193794 A1 | 10/2003 | Reis et al. | | |
| 2004/0125567 A1* | 7/2004 | Lee | ..................... | H01L 23/4093 361/707 |
| 2005/0111194 A1 | 5/2005 | Sohn | | |
| 2007/0086170 A1* | 4/2007 | Liang | .................... | H01L 23/367 361/719 |
| 2010/0157544 A1* | 6/2010 | Tsao | ...................... | H05K 9/0032 361/720 |
| 2010/0246137 A1 | 9/2010 | Magana et al. | | |
| 2011/0228486 A1 | 9/2011 | Lanni | | |
| 2011/0242764 A1 | 10/2011 | Hill et al. | | |
| 2013/0120957 A1* | 5/2013 | Werner | ................ | H05K 9/0032 361/818 |
| 2013/0265722 A1 | 10/2013 | Hill et al. | | |

\* cited by examiner

HARDWARE SHIELD DEVICE AND ELECTRONIC DEVICES INCLUDING THE SAME

CROSS-REFERENCE TO RELATED APPLICATION(S)

This application claims the benefit under 35 U.S.C. § 119(e) of a U.S. Provisional application filed on Feb. 24, 2014 in the U.S. Patent and Trademark Office and assigned Ser. No. 61/944,055, and under 35 U.S.C. § 119(a) of a Korean patent application filed on Oct. 15, 2014 in the Korean Intellectual Property Office and assigned Serial number 10-2014-0139284, the entire disclosure of each of which is hereby incorporated by reference.

TECHNICAL FIELD

The present disclosure relates to a hardware shield device.

BACKGROUND

Wireless communication technology has been developed as a technology for easily transferring and sharing various types of data, such as sounds, images and pictures. With the development of wireless communication technology, diversification of information and a speed of communication have been improved. As functions supported by mobile devices are increased, the performance of central processing units, which may be referred to as application processors (APs), and/or application chips, for implementing the functions are also improved.

As clocks (CLK) of the APs are increased, temperatures of the APs are increased, causing problems in the use thereof. Furthermore, noise generated by the APs affects peripheral device elements mounted on electronic devices, causing incorrect operation of the peripheral device elements or electrical damage thereto.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a hardware shield device for reducing heat and shielding noise of an electronic device and an electronic device including the same.

In accordance with an aspect of the present disclosure, a device is provided. The device includes a shield can including an opening through which at least a part of a device element is exposed, a heat dissipation module including at least a part that is mounted on the opening, a cover member connected to one surface of the heat dissipation module, and a conductor arranged between the shield can and the cover member, the conductor surrounding both the opening and at least a part of a periphery of the heat dissipation module.

In accordance with another aspect of the present disclosure, an electronic device is provided. The electronic device includes a printed circuit board, an electronic chip arranged on the printed circuit board, a shield can including an opening through which at least a part of the electronic chip is exposed, a heat dissipation module including at least a part that is mounted on the opening or a periphery of the opening, a cover member connected to one surface of the heat dissipation module, and a conductor surrounding both the opening and a periphery of the heat dissipation module.

In accordance with another aspect of the present disclosure, a device is provided. The device includes a shield can including an opening through which at least a part of a device element is exposed, a heat dissipation module including at least a part that is mounted on the opening, a cover member connected to one surface of the heat dissipation module, and a conductor arranged between the shield can and the cover member, the conductor surrounding both of at least a part of a gap between the opening and the heat dissipation module.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
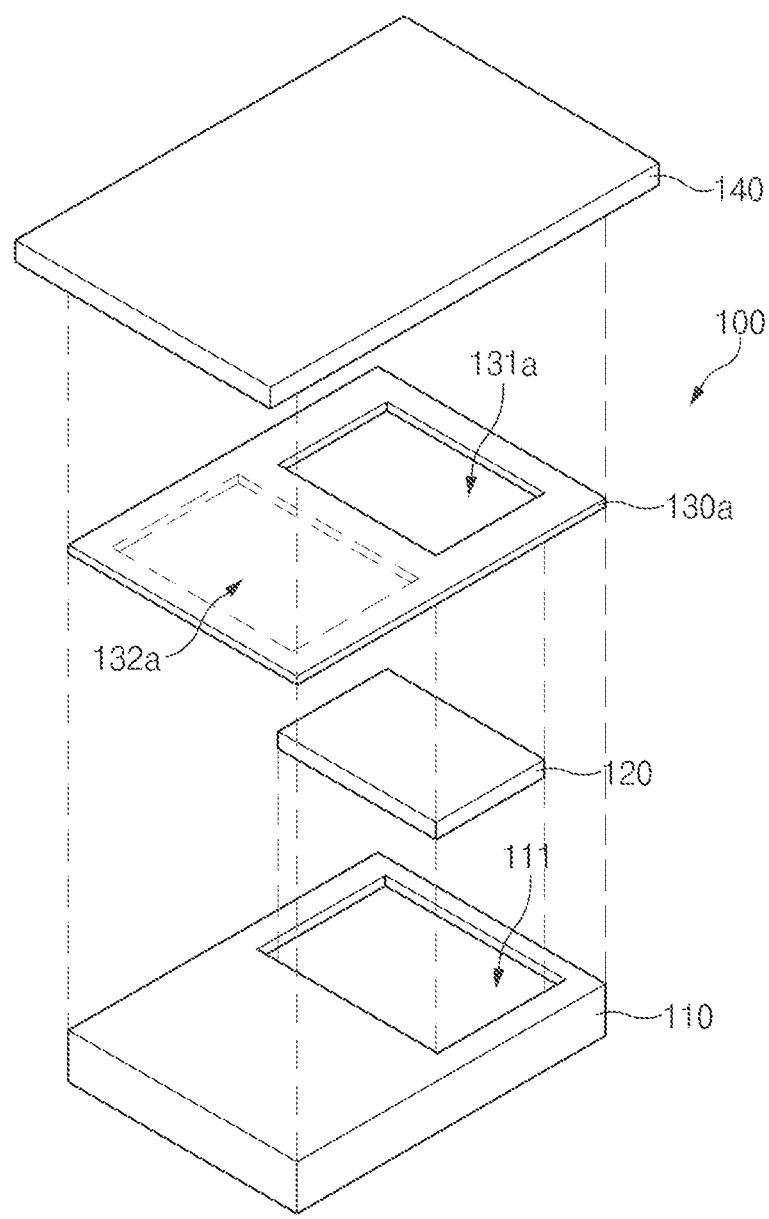
FIG. 1A is an exploded view of a hardware shield device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary.

Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms such as "first", "second" and the like used herein may refer to various elements of an embodiment of the present disclosure, but do not limit the elements. For example, such terms do not limit the order and/or priority of the elements. Furthermore, such terms may be used to distinguish one element from another element. For example, "a first user device" and "a second user device" indicate different user devices. For example, without departing the scope of the rights of an embodiment of the present disclosure, a first element may be referred to as a second element or vice versa.

It will be understood that when an element is referred to as being "connected" or "coupled" to another element, it can be directly connected or coupled to the other element or intervening elements may be present. In contrast, when an element is referred to as being "directly connected" or "directly coupled" to another element, it should be understood that there are no intervening elements. In the present disclosure, the term "connection" or an electrical configuration that may be construed as "connection" includes a direct connection or an indirect connection, and may be established electrically and does not need to be established physically, unless otherwise specified or unless the above-mentioned configuration is illogical or cannot be carried out by those skilled in the art.

The terminology used herein is not for delimiting the various embodiments of the present disclosure but for describing specific examples of the present disclosure. The terms of a singular form may include plural forms unless otherwise specified.

The terms used herein, including technical or scientific terms, have the same meanings as understood by those skilled in the art unless otherwise defined herein. The commonly used terms such as those defined in a dictionary should be interpreted in the same context as in the related art and should not be interpreted in an idealized or overly formal sense unless otherwise defined explicitly.

Electronic devices according to an embodiment of the present disclosure may include a structure in which a shield may be arranged. For example, the electronic devices may include at least one of smartphones, tablet personal computers (PCs), mobile phones, video telephones, electronic book readers, desktop PCs, laptop PCs, netbook computers, personal digital assistants (PDAs), portable multimedia players (PMPs), Motion Picture Experts Group (MPEG) audio layer 3 (MP3) players, mobile medical devices, cameras, and/or wearable devices, e.g., head-mounted-devices (HMDs, such as electronic glasses, electronic apparel, electronic bracelets, electronic necklaces, electronic accessories, electronic tattoos, and/or smart watches.

According to an embodiment, the electronic devices may be smart home appliances provided with a shield can structure. The smart home appliances may include at least one of, for example, TVs, DVD players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles, electronic dictionaries, electronic keys, camcorders, and electronic picture frames.

According to an embodiment, the electronic devices may include at least one of medical devices, e.g., magnetic resonance angiography (MRA), magnetic resonance imaging (MRI), computed tomography (CT), scanners, and ultrasonic devices, navigation devices, global positioning system (GPS) receivers, event data recorders (EDRs), flight data recorders (FDRs), vehicle infotainment devices, electronic equipment for a ship, e.g., navigation systems and gyrocompasses, avionics, security devices, head units for vehicles, industrial and/or home robots, automatic teller's machines (ATMs), and/or points of sales (POSs).

According to an embodiment, the electronic devices may include at least one of parts of furniture or buildings/structures including a shield can structure, electronic boards, electronic signature receiving devices, projectors, and/or measuring instruments, e.g., water meters, electricity meters, gas meters, and/or wave meters. The electronic devices according to the various embodiments may be one or more combinations of the above-mentioned devices. Furthermore, the electronic devices according to an embodiment may be flexible devices. It would be obvious to those skilled in the art that the electronic devices according to an embodiment are not limited to the above-mentioned devices.

Hereinafter, electronic devices according to an embodiment will be described with reference to the accompanying drawings. The term "user" used herein may refer to a person who uses an electronic device or may refer to a device, e.g., an artificial electronic device, that uses the electronic device.

FIG. 1A is an exploded view of a hardware shield device according to an embodiment of the present disclosure.

Referring to FIG. 1A, a hardware shield device 100 may include a shield can 110, a heat dissipation module 120, which may be a thermal interface material (TIM) tape, a conductive gasket 130a and a cover member 140. According to an embodiment, the conductive gasket 130a may be attached to one side of the cover member 140. The cover member 140 may be at least a part of a housing of an electronic device. For example, the cover member 140 may be a part of an electronic device housing, such as a rear cover and/or a battery cover, surrounding a printed circuit board on which the shield can 110 is arranged. According to an embodiment, the conductive gasket 130a may be attached to one side of the heat dissipation module 120.

According to an embodiment, an opening 111 may be provided at and/or near a center of the shield can 110, and the conductive gasket 130a may be arranged on the shield can 110 around the opening 111. Since the cover member 140 is arranged on the shield can 110 and the conductive gasket 130a, noise generated from a device element, e.g., a processor (not shown) of which at least a part is exposed to the outside through the opening 111 may be shielded. Furthermore, since the heat dissipation module 120 is arranged in the opening 111 such that the heat dissipation module 120 is positioned between the cover member 140 and the device element, heat generated from the device element may be transferred to the cover member 140. Accordingly, the heat generated from the device element arranged in the shield can 110 may be dissipated by the dissipation module 120 through the cover member 140.

According to an embodiment, the shield can 110 may include a polygonal body part, or in other words the shield can 110 may have a polygonal shape, which may also be a tetragonal body part, at least a part of a tetragon, an edge or a center of which is modified, and four side walls extending from edges of the polygonal body part, the side walls being vertical to the polygonal body part. Alternatively, the shield can 110 may include at least one of the side walls bent at a certain angle at the edges of the polygonal body part. Here, the side walls may have different or identical thicknesses and heights, and each side wall may have a same height or different heights. The shield can 110 is illustrated in the drawings as if the shield can 110 is tetragonal, but the present disclosure is not limited thereto. For example, the shield can 110 may have any suitable shape, such as at least a part thereof is stepped, bent and/or opened, according to a designed structure of an electronic device.

At least a part of ends of the side walls of the shield can 110 may be inserted and fixed to a printed circuit board arranged in an electronic device. According to an embodiment, the shield can 110 may include more than one opening 111 so that an internal device element is exposed to the outside. Here, the opening 111 may have various shapes according to the size and/or shape of the device element. Furthermore, the opening 111 may be provided as a plurality of holes. The drawings are simplified to illustrate the structure in which the heat dissipation module 120 is arranged in the opening 111. According to an embodiment, in the case where the opening 111 is provided in plurality, the heat dissipation module 120 may be provided in plurality corresponding to each of the plurality of opening s111.

According to an embodiment, the opening 111 may have various shapes so that at least a part of an internal device element, e.g., a central processing unit (CPU) and/or an application processor (AP) is exposed. The present disclosure is not limited to the above-mentioned shapes of the opening 111 and/or the heat dissipation module 120. For example, the opening 111 may equal the heat dissipation module 120 in size or may be larger than the heat dissipation module 120, while being smaller than an internal AP. Alternatively, the opening 111 may equal one side of the heat dissipation module 120 in size. The opening 111 may be provided as at least one hole. In this case, the heat dissipation module 120 may include at least one pillar that passes through the opening 111 to contact with a device element arranged in the shield can 110.

According to an embodiment, the shield can 110 may be formed of a conductive material. For example, the shield can 110 may be formed of iron, aluminum, steel use stainless (SUS) or various metal alloys. Furthermore, the shield can 110 may be designed to have a certain stiffness to protect a device element from impact.

At least a part of the heat dissipation module 120 may be arranged at one side of the opening 111 formed in the shield can 110 or may be arranged around the opening 111. For example, at least a part of the heat dissipation module 120 may pass through the opening 111. Alternatively, at least a part of the heat dissipation module 120 may contact with a device element at a surface of the opening 111. One end of the heat dissipation module 120 may be attached to the cover member 140, and another end of the heat dissipation module 120 may pass through the opening 111 and contact with the device element. Alternatively, the other end of the heat dissipation module 120 may face the opening 111 so as to contact with the device element of which at least a part is arranged on the opening 111. As described above, the heat dissipation module 120 may be arranged in consideration of heat dissipation of the device element arranged in the shield can 110. According to an embodiment, the heat dissipation module 120 may be such arranged that the device element is physically connected and/or contacted thereto. According to the various embodiments, the heat dissipation module 120 may include at least one corrugation for efficient heat dissipation. For example, the heat dissipation module 120 may have a structure in which a plurality of substrates, which may be of different materials or identical materials, is stacked. Alternatively, the heat dissipation module 120 may include a centric body (not shown) and a plurality of wing parts (not shown) extended from the centric body. In an embodiment, the structure of the heat dissipation module 120 is not limited, and the heat dissipation module 120 may have various shapes according to an intended design. Although the heat dissipation module 120 is illustrated in the drawings as if the heat dissipation module 120 is tetragonal, the heat dissipation module 120 may have an elliptical shape, a polygonal shape and/or various curved surfaces.

According to an embodiment, at least a part of the heat dissipation module 120 may pass through an open hole 131a formed in the conductive gasket 130a. To this end, one side of the heat dissipation module 120 may be smaller than the open hole 131a, i.e., the heat dissipation module 120 may have a cross section smaller than that of the open hole 131a. A part of the heat dissipation module 120, at least a part of which is arranged inside the open hole 131a of the conductive gasket 130a, may be connected and/or contacted to the cover member 140. The heat dissipation module 120 may serve to dissipate the heat generated from the device element and transfer the heat to the cover member 140. The heat dissipation module 120 may have a certain thickness so that at least a part of the heat dissipation module 120 is connected to the cover member 140 while being mounted in the opening 111 and the open hole 131a after the heat dissipation module 120 is arranged to be connected and/or contacted to the device element. To this end, a thickness of at least a part of the heat dissipation module 120 may be equal to or larger than a sum of a thickness of the shield can 110 defining the opening 111 and a thickness of the conductive gasket 130a defining the open hole 131a. An adhesive layer may be provided to at least one of a front surface, a rear surface and a side surface of the heat dissipation module 120. Therefore, the heat dissipation module 120 may be bonded to the device element. Alternatively, the heat dissipation module 120 may be bonded to the cover member 140. Alternatively, the heat dissipation module 120 may be inserted into the open hole 131a of the conductive gasket 130a, and then may be bonded to side parts of the conductive gasket 130a forming the open hole 131a.

According to an embodiment, the conductive gasket 130a may be such arranged so as to surround the periphery of the opening 111 of the shield can 110. Furthermore, the conductive gasket 130a may be such arranged so as to surround an edge of the heat dissipation module 120 arranged in the opening 111. According to an embodiment, one side of the conductive gasket 130a may face the shield can 110, and the other side of the conductive gasket 130a may face the cover member 140. For example, the conductive gasket 130a may be arranged so as to surround the opening 111 and at least a part of the heat dissipation module 120. Furthermore, the conductive gasket 130a may be physically coupled to the cover member 140. According to an embodiment, the conductive gasket 130a may be formed so as to correspond to a shape of at least a part of the shield can 110. For example, the conductive gasket 130a may be provided in the shape of a band including the open hole 131a corresponding to the opening 111 formed in the shield can 110. According an embodiment, the conductive gasket 130a may include, additionally or alternatively, at least one hole 132a besides the open hole 131a. The at least one hole 132a may be formed such that at least a part of the shield can 110 is exposed. According to an embodiment, a region of the conductive gasket 130a excepting the open hole 131a may have the shape of a closed panel. According to an embodiment, an adhesive layer may be provided to at least one of front and rear surfaces of the conductive gasket 130a shaped like a panel.

According to an embodiment, at least a part of the conductive gasket 130a may be elastic. For example, at least a partial region of the conductive gasket 130a, which is arranged adjacent to the opening 111 of the shield can 110, may include a sponge structure. Alternatively, at least a partial region of the conductive gasket 130a adjacent to the open hole 131a may be formed of an elastic material. According to an embodiment, the conductive gasket 130a may have the shape of a metallic mesh. According to an embodiment, the conductive gasket 130a may include a polymer-based or urethane-based inner part and a conductive outer cover. According to an embodiment, the conductive gasket 130a may be formed of a non-elastic metallic material.

According to an embodiment, the conductive gasket 130a may dissipate the heat generated from at least one device element and transferred to at least one of the shield can 110, the heat dissipation module 120 and the cover member 140. The conductive gasket 130a arranged between the cover member 140 and the shield can 110 may close a gap region formed between the heat dissipation module 120 and the opening 111 of the shield can 110. Accordingly, the cover member 140 may shield noise generated from the device element, e.g., a CPU, an AP and/or an electronic chip.

The cover member 140 may cover the shield can 110, while covering one surface of the conductive gasket 130a and one surface of the heat dissipation module 120. For example, the cover member 140 may be connected and/or physically contacted to at least one of a front surface of the conductive gasket 130a, a front surface of the heat dissipation module 120 and a front surface of the shield can 110. The cover member 140 may be formed of various materials, for example, a conductive material such as metal, a metal-nonmetal alloy and/or a metal alloy. The cover member 140 may receive, from the heat dissipation module 120, the heat generated from the device element to dissipate the heat. According to an embodiment, the cover member 140 may be at least a part of a bracket, a rear cover or a batter cover. At least a part of the cover member 140 may be such formed as to correspond to an outer shape of an electronic device.

Figure 1B:
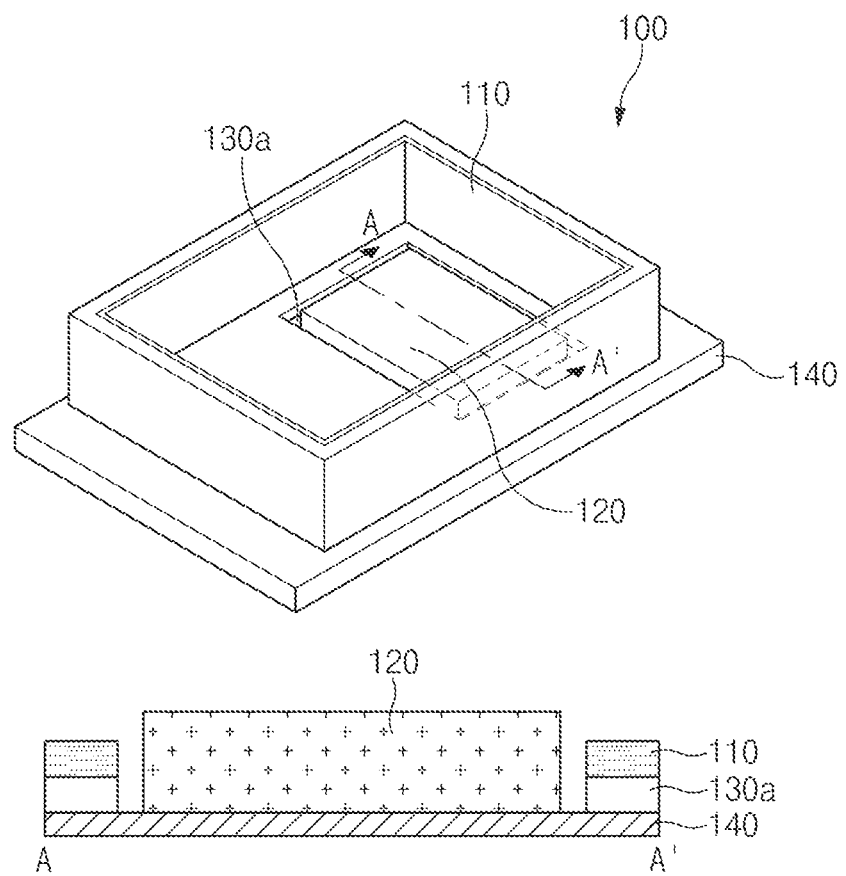
FIG. 1B illustrates a perspective view and a cross section of a hardware shield device according to an embodiment of the present disclosure.

FIG. 1B illustrates a perspective view and a cross section of the hardware shield device according to an embodiment of the present disclosure.

Referring to FIG. 1B, in the hardware shield device 100, the shield can 110 may be arranged on the cover member 140, while the heat dissipation module 120 and the conductive gasket 130a are arranged on the cover member 140. One surface of the heat dissipation module 120 and one surface of the conductive gasket 130a may be arranged on the cover member 140. Referring to the cross section illustrated in FIG. 1B, the cover member 140 may be arranged at the bottom, and one surface of the cover member 140 may be connected to the heat dissipation module 120. According to an embodiment, a surface of the cover member 140 facing the heat dissipation module 120 may be projected, e.g., may be embossed. According to an embodiment, the surface of the cover member 140 facing the heat dissipation module 120 may be recessed, e.g., may be engraved. In this case, a thickness of the heat dissipation module 120 may be determined in consideration of an engraved part of the cover member 140. At least one surface of the heat dissipation module 120 may be arranged inside the open hole 131a of the conductive gasket 130a. The other surface of the heat dissipation module 120 may be connected to a device element (not shown) of an electronic device.

Figure 1C:
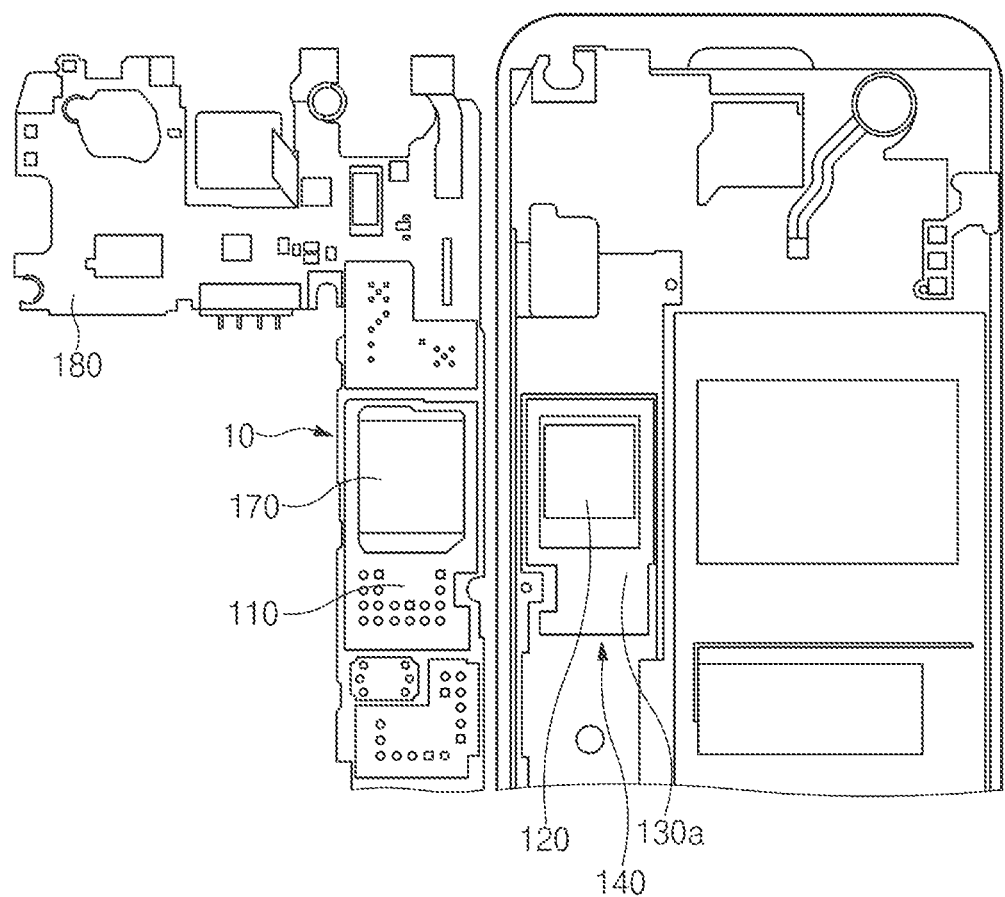
FIG. 1C illustrates a separate electronic device including a hardware shield device according an embodiment of the present disclosure.

FIG. 1C illustrates a separate electronic device including a hardware shield device according to an embodiment of the present disclosure.

Referring to FIG. 1C, an electronic device 10 may include a device element 170 arranged on a printed circuit board 180, the shield can 110 surrounding at least a part of the exterior of the device element 170, the cover member 140 for shielding conductivity and/or noise, and the conductive gasket 130a and the heat dissipation module 120 arranged on the cover member 140.

In the electronic device 10, an upper surface of the shield can 110 covering the device element 170 may contact with the conductive gasket 130a. As the printed circuit board 180 is arranged on the cover member 140, the device element 170 may contact with the heat dissipation module 120 through an open hole formed in the shield can 110. According to the electronic device 10 described above, the heat generated from the device element 170 may be dissipated through the heat dissipation module 120 and the cover member 140, and noise generated from the device element 170 may be blocked as the device element 170 is covered by the shield can 110 and the conductive gasket 130a. The conductive gasket 130a may include a first region defining an open hole in which the heat dissipation module 120 is arranged, and a second region for improving an interface with the shield can 110.

Figure 1D:
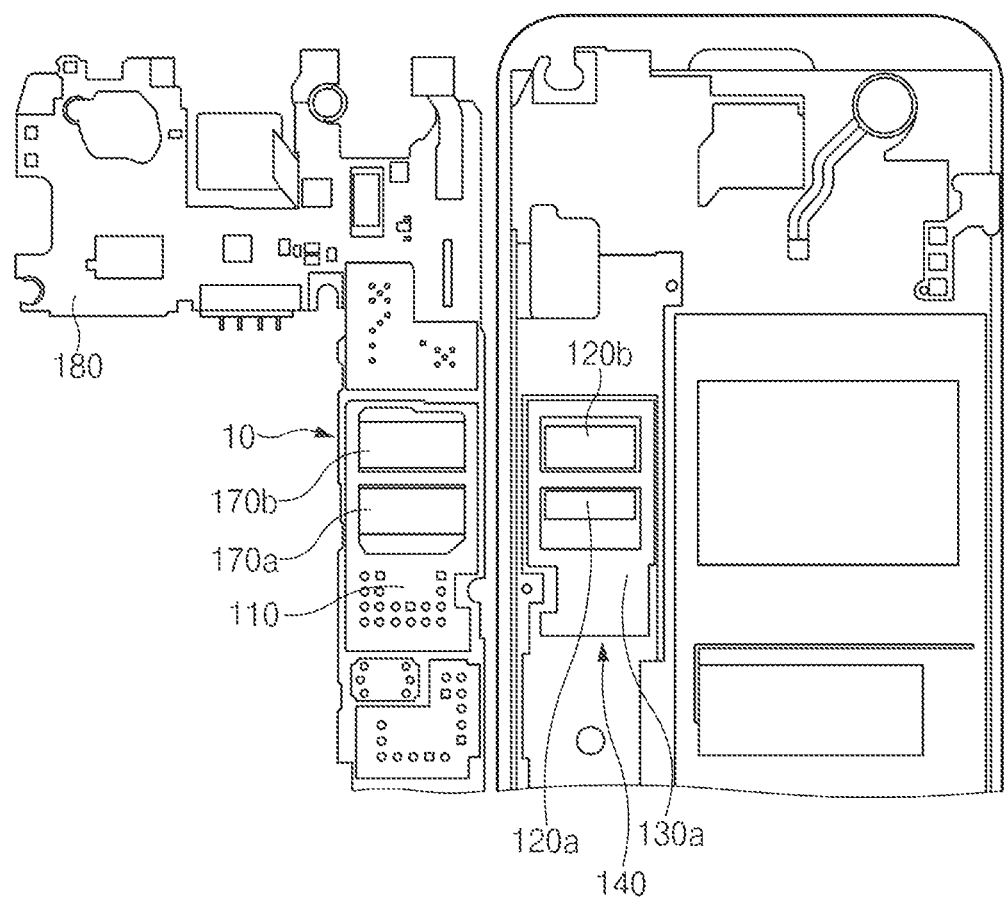
FIG. 1D illustrates another type of an electronic device including a hardware shield device according to an embodiment of the present disclosure.

FIG. 1D illustrates a separate electronic device including a hardware shield device according to an embodiment of the present disclosure.

Referring to FIG. 1D, the electronic device 10 may include device elements 170a and 170b arranged on the printed circuit board 180, the shield can 110 surrounding at least parts of the exteriors of the device elements 170a and 170b, the cover member 140 for shielding conductivity or noise, and the conductive gasket 130a and heat dissipation modules 120a and 120b arranged on the cover member 140.

In the electronic device 10, the heat dissipation modules 120a and 120b may be arranged so that the heat generated from the plurality of device elements 170a and 170b is dissipated. For example, the heat dissipation module 120a may contact with the device element 170a, and the heat dissipation module 120b may contact with the device element 170b. A plurality of openings may be provided to the shield can 110 so that at least parts of the device elements 170a and 170b are exposed. The device elements 170a and 170b may contact with the heat dissipation modules 120a and 120b respectively through the plurality of openings provided to the shield can 110. The conductive gasket 130a may be arranged on one side of the cover member 140, including holes for exposing the heat dissipation modules 120a and 120b. The cover member 140 may be, for example, at least a part of a housing of the electronic device 10.

According to an embodiment, at least one of the heat dissipation modules 120a and 120b may pass through the opening of the shield can 110 to contact with the device elements 170a and 170b. According to the various embodiments, in the case where the device elements 170a and 170b are flush with the shield can 110 to have the same height as the opening of the shield can 110, the heights of the heat dissipation modules 120a and 120b may be equal to or similar to the height of the conductive gasket 130 so that the heat dissipation modules 120a and 120b may contact with the device elements 170a and 170b. An adhesive layer or a conductive adhesive layer may be arranged between the heat dissipation modules 120a and 120b and the device elements 170a and 170b so that the heat dissipation modules may be strongly bonded to the device elements.

Figure 2:
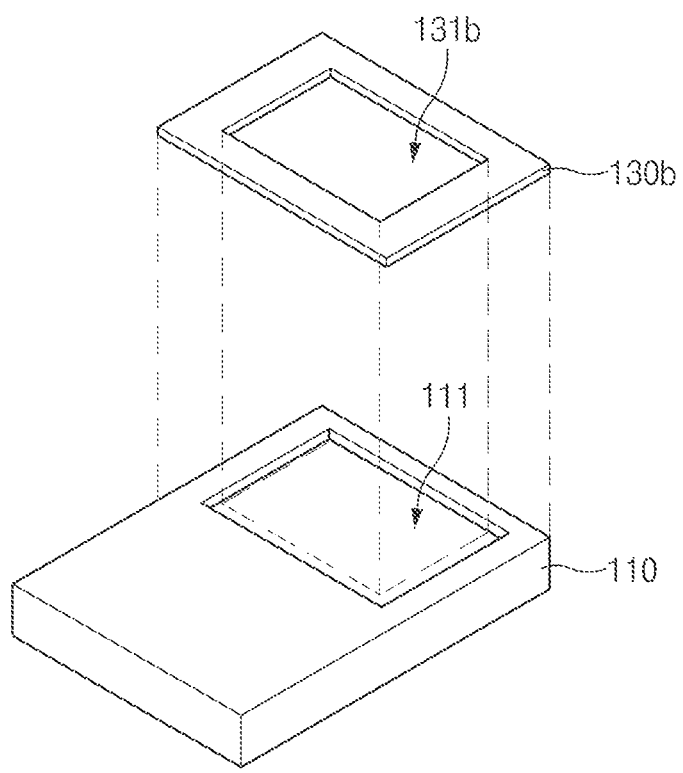
FIG. 2 illustrates another type of a conductive gasket according to an embodiment of the present disclosure.

FIG. 2 illustrates another type of a conductive gasket according to an embodiment of the present disclosure.

Referring to FIG. 2, a conductive gasket 130b may have a shape corresponding to a shape of a part of the shield can 110. For example, the conductive gasket 130b may have a shape corresponding to a part of the periphery of a region of the shield can 110 in which the opening 111 is defined. Accordingly, the conductive gasket 130b may have a length smaller than that of the shield can 110. The conductive gasket 130b may include an open hole 131b. The open hole 131b may be equal in size to the opening 111 of the shield can 110, or may be smaller than the opening 111. According to an embodiment, in a case where the open hole 131b is smaller than the opening 111, the conductive gasket 130b may be arranged on the shield can 110 so as to cover an edge region of the opening 111. According to an embodiment, the open hole 131b may have the same size as that of one surface of the heat dissipation module 120. Alternatively, the open hole 131b may be larger than one surface of the heat dissipation module 120. According to an embodiment, the open hole 131b may be smaller than one surface of the heat dissipation module 120. In this case, the heat dissipation module 120 may be interference-fit to the conductive gasket 130b. According to an embodiment, an adhesive layer may be provided to at least one of front and rear surfaces of the conductive gasket 130b. Therefore, the conductive gasket 130b may be bonded to the shield can 110. Furthermore, the conductive gasket 130b may be bonded to the cover member 140 arranged thereon. According to an embodiment, adhesive layers (not shown) may be provided to side parts of the conductive gasket 130b defining the open hole 131b. Therefore, the conductive gasket 130b may be bonded to the heat dissipation module 120 inserted into the open hole 131a.

Figure 3:
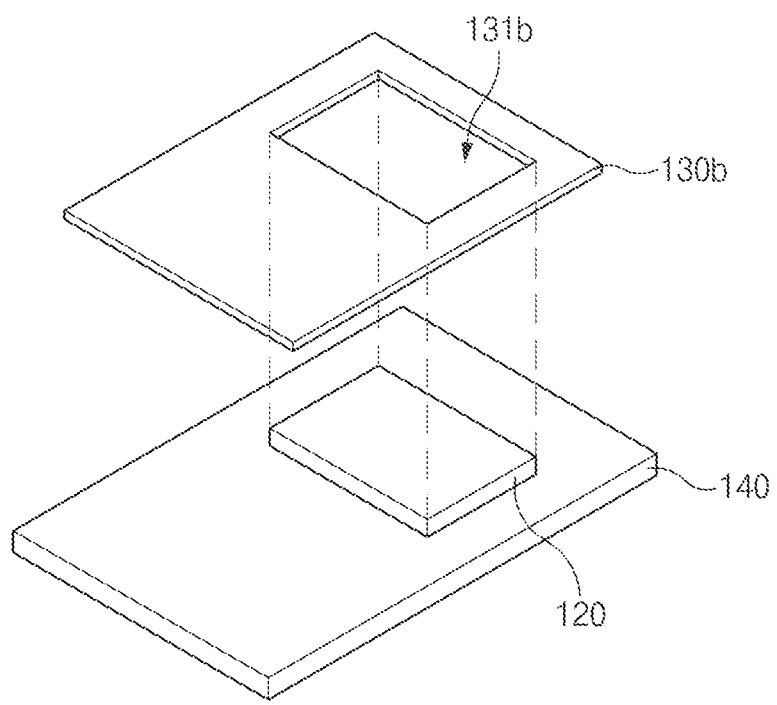
FIG. 3 illustrates another type of a cover member and a conductive gasket according to an embodiment of the present disclosure.

FIG. 3 illustrates another type of a cover member and a conductive gasket according to an embodiment of the present disclosure.

Referring to FIG. 3, the cover member 140 may include a surface on which the heat dissipation module 120 and the conductive gasket 130b are arranged. Furthermore, at least one heat dissipation module 120 may be arranged on one side of the cover member 140. The heat dissipation module 120 may be integrated with the cover member 140. In a case where the cover member 140 is formed by casting or injection molding, a mold may include a pattern for forming the heat dissipation module 120.

According to an embodiment, the conductive gasket 130b may include the open hole 131b for mounting at least a part of the heat dissipation module 120. The conductive gasket 130b may be fixed on the cover member 140 so that the heat dissipation module 120 is exposed, and then may face a one front side of the shield can 110 to undergo an assembly process. For example, the conductive gasket 130b may be arranged on the cover member 140 so that the heat dissipation module 120 is exposed through the open hole 131b.

An adhesive layer may be formed on at least one surface of the conductive gasket 130b. The conductive gasket 130b may be formed of a conductive material so as to support heat dissipation of the heat dissipation module 120 and/or the cover member 140. Furthermore, the conductive gasket 130b may shield noise generated from a device element of which heat is dissipated by the heat dissipation module 120.

Figure 4:
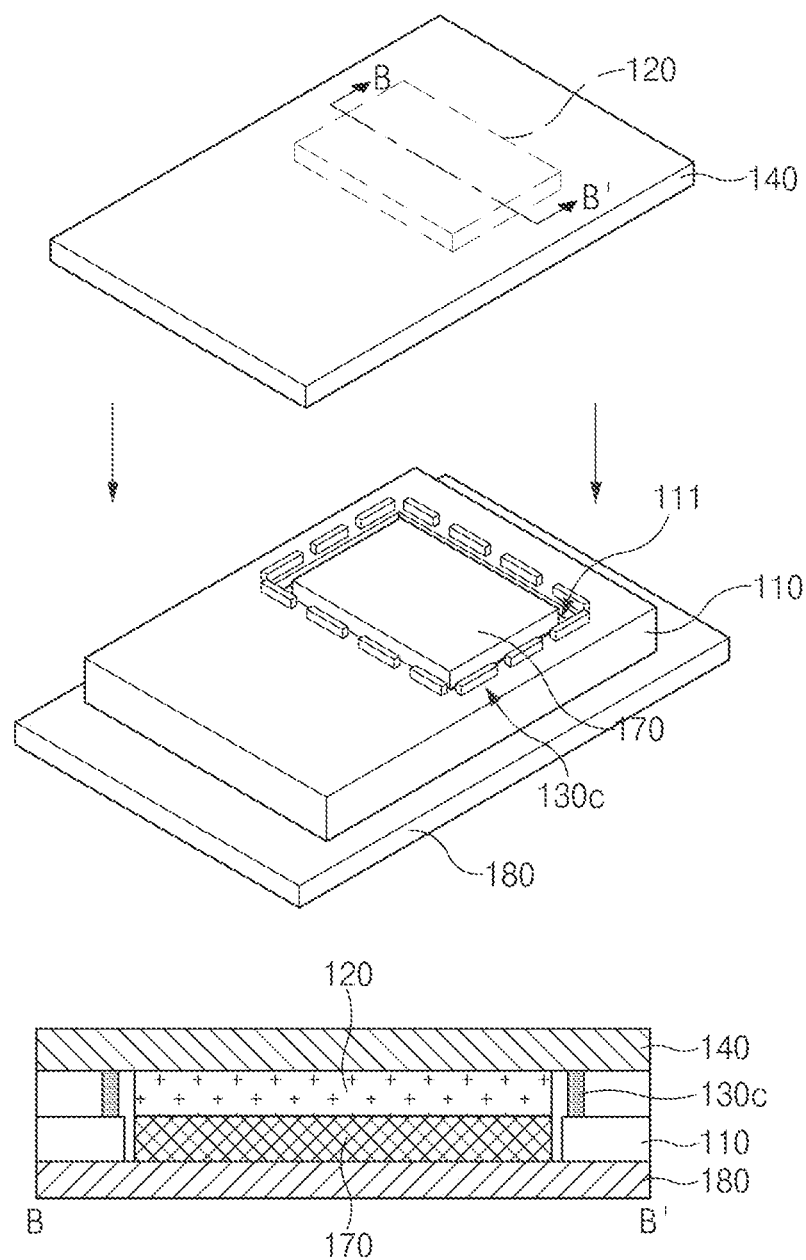
FIG. 4 illustrates a hardware shield device including a conductive clip according to an embodiment of the present disclosure.

FIG. 4 illustrates a hardware shield device including a conductive clip according to an embodiment of the present disclosure.

Referring to FIG. 4, the hardware shield device 100 may include the shield can 110, a conductive clip 130c, the heat dissipation module 120 and the cover member 140. Since the conductive clip 130c is arranged on a partial region of the shield can 110, noise generated from a gap formed between the heat dissipation module 120 and the opening 111 of the shield can 110 may be shielded, while supporting heat dissipation of the heat dissipation module 120.

According to an embodiment, the opening 111 may be formed in one side of the shield can 110 as described above. According to an embodiment, the shield can 110 may be inserted and fixed onto the printed circuit board 180 on which the device element 170 is arranged. The opening 111 may be arranged so that the device element 170 is exposed. The heat dissipation module 120 may be electrically and/or physically connected to the device element 170 through the opening 111.

At least one conductive clip 130c may surround the opening 111 formed in the shield can 110. According to an embodiment, a plurality of conductive clips 130c may be arranged at regular intervals or non-equal intervals on regions adjacent to side walls of the shield can 110 at the periphery of the opening 111. According to an embodiment, the conductive clips 130c may protrude from one surface of the shield can 110 vertically or at a certain angle, surrounding the opening 111 of the shield can 110. One surface of the conductive clip 130c may be connected or inserted and fixed to the shield can 110. Furthermore, the other surface of the conductive clip 130c may be connected and/or contacted to the cover member 140.

According to an embodiment, the conductive clips 130c may be bent towards the inside of the opening 111 at the side walls of the shield can 110 forming the opening 111. Accordingly, at least one of the conductive clips 130c may be connected and/or contacted to the heat dissipation module 120. Referring to the illustrated cross section, the device element 170 may be arranged on the printed circuit board 180, and the shield can 110 may be arranged so as to cover at least a part of the device element 170 or at least a part of the printed circuit board including the device element 170. Here, the opening 111 of the shield can 110 may be arranged so that at least a part of the device element 170 is exposed.

At least a part of the heat dissipation module 120 may be arranged inside the opening 111 of the shield can 110. The heat dissipation module 120 may be connected and/or contacted to one surface of the device element 170, with at least a part of the heat dissipation module 120 being arranged inside the opening 111. According to an embodiment, the device element 170 may protrude to a surface of the opening 111 of the shield can 110. In this case, the heat dissipation module 120 may be connected and/or contacted to the device element 170 at the surface of the opening 111 of the shield can 110.

The other surface of the heat dissipation module 120 may be connected and/or contacted to the cover member 140. At least one of the conductive clips 130c may be arranged alongside the heat dissipation module 120 at one surface of the shield can 110. Since the conductive clips 130c surround a side part of the heat dissipation module 120, the conductive clips 130c may support the heat dissipation through the cover member 140, while shielding noise generated from the device element. According to an embodiment, the conductive clips 130c protruding from one surface of the shield can 110 may be bent towards the inside of the opening 111. In this case, at least a part of the conductive clips 130c may be connected and/or contacted to a side part of the heat dissipation module 120. Accordingly, the conductive clips 130c may be arranged so as to surround a side part of the heat dissipation module 120.

Figure 5:
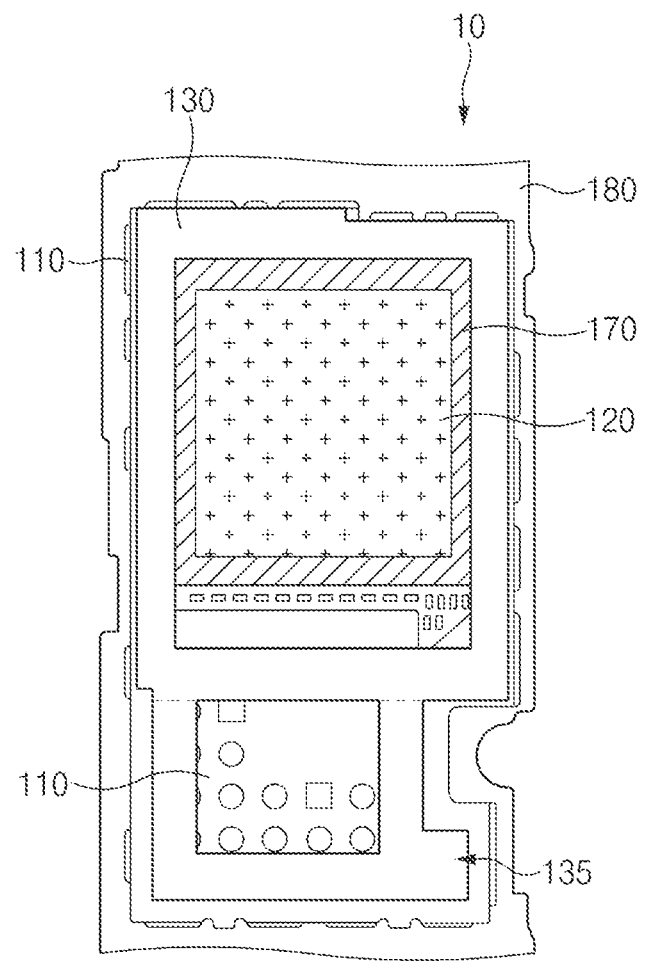
FIG. 5 illustrates a part of an electronic device including a hardware shield device according to an embodiment of the present disclosure.

FIG. 5 illustrates a part of an electronic device including a hardware shield device according to an embodiment of the present disclosure.

Referring to FIG. 5, the electronic device 10 may include the printed circuit board 180, the device element 170, which may be an AP (not shown) and/or an electronic chip, the shield can 110, a conductor 130, which may include the conductive gaskets 130a and 130b or the conductive clip 130c, and the heat dissipation module 120. Additionally or alternatively, the electronic device 10 may further include the cover member 140 and a back cover and/or a battery cover for covering the cover member 140. Furthermore, the electronic device 10 may include a display (not shown) connected to the printed circuit board 180 to output screen information and a communication module (not shown) for supporting a communication service.

At least one device element for operating the electronic device 10, for example, the device element 170, may be arranged on at least one side of the printed circuit board 180 according to the various embodiments. Furthermore, the shield can 110 for covering the device element 170 may be arranged on one side of the printed circuit board 180. Here, the shield can 110 may have an opening formed therein so that at least a part of the device element 170 may be exposed. The heat dissipation module 120 may be connected to a surface of the at least a part of the device element 170 that is exposed. The heat dissipation module 120 may be connected to one surface of the device element 170 through the opening of the shield can 110.

The conductor 130 may be arranged on a front surface of the shield can 110. Here, the conductor 130 may surround the periphery of the opening of the shield can 110. Accordingly, the conductor 130 may surround the heat dissipation module 120 arranged inside the opening of the shield can 110. According to the shape of the conductor 130, at least a part of a region other than a region where the heat dissipation module 120 is arranged may be exposed through the open hole of the conductor 130. According to an embodiment, a thickness of the conductor 130 may be equal to or greater than a length of a gap between the shield can 110 and the cover member 140. As described above, at least a part of the conductor 130 may be elastic. In the drawing, the conductor 130 may include an additional region 135 for covering a partial region of the shield can 110. According to an embodiment, the additional region 135 may be removed depending on a design. The conductor 130 may include at least one of the above-mentioned conductive gasket 130a and the conductive clip 130c.

Although not illustrated in the drawing, the cover member 140 may be connected and/or contacted to one surface of the heat dissipation module 120, while covering an upper surface of the conductor 130, as described above with reference to FIGS. 1 to 4. Accordingly, a region of the device element 170, which is exposed without being covered by the heat dissipation module 120 may be closed by the cover member 140, the conductor 130 and the shield can 110.

Figure 6:
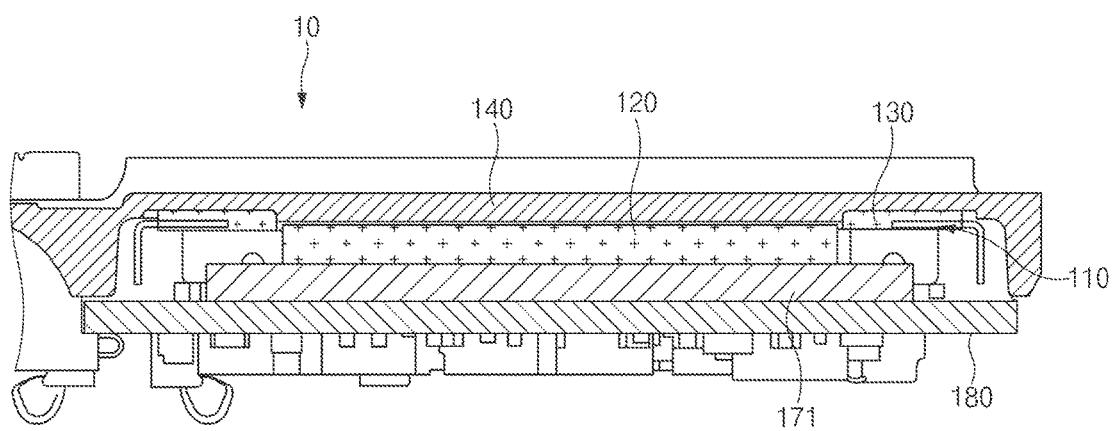
FIG. 6 is a cross sectional view of a part of an electronic device including a hardware shield device according to an embodiment of the present disclosure.

FIG. 6 is a cross sectional view of a part of an electronic device including a hardware shield device according to an embodiment of the present disclosure.

Referring to FIG. 6, the electronic device 10 may include the printed circuit board 180 on which at least one device element (e.g. AP 171) is arranged, the AP 171 arranged on the printed circuit board 180, the shield can 110 for surrounding the perimeter of the printed circuit board 180 while covering the AP 171, the heat dissipation module 120 connected to the AP 171 exposed through the opening of the shield can 110, the cover member 140 connected to the heat dissipation module 120, and the conductor 130 arranged between the cover member 140 and the shield can 110. Additionally or alternatively, the electronic device 10 may further include a back cover and/or a battery cover for covering the cover member 140.

As described above, the conductor 130 may surround the edge of the opening of the shield can 110, and may be arranged between the shield can 110 and the cover member 140 so as to close a gap between the heat dissipation module 120 and the shield can 110.

According to an embodiment, the conductor 130 may be formed by applying a conductive material. For example, the conductive material may be applied on the periphery of the shield can 110 so that the conductor 130 is formed, and/or the conductive material may be applied on the cover member 140 so that the conductor 130 is formed. The electronic device 10 having the hardware shield device 100 with the conductor 130 may improve the dissipation of heat of the AP 171 and the shielding of noise.

As described above, the hardware shield device according to an embodiment may include a shield can including an opening through which at least a part of a device element is exposed, a heat dissipation module of which at least a part is mounted on the opening, a cover member connected to one surface of the heat dissipation module, and a conductor arranged between the shield can and the cover member, the conductor surrounding the opening and at least a part of the periphery of the heat dissipation module.

According to an embodiment, the conductor may include at least one adhesive layer bonded to at least one of the shield can or the cover member.

According to an embodiment, the conductor may include an open hole corresponding to the opening.

According to an embodiment, the conductor may include an adhesive layer bonded to the heat dissipation module on a side wall forming the open hole.

According to an embodiment, the open hole may not be larger than the opening.

According to an embodiment, the conductor may include at least one clip arranged at the periphery of the opening.

According to an embodiment, the conductor may be elastic.

According to an embodiment, the conductor may be formed so as to correspond to an overall shape of the shield can.

According to an embodiment, the heat dissipation module may be integrated with the cover member.

According to an embodiment, the heat dissipation module may contact with the device element arranged in the shield can at a surface of the opening.

According to an embodiment, at least a part of the heat dissipation module may be arranged inside the opening so that the heat dissipation module may contact with the device element arranged in the shield can.

As described above, according to an embodiment, a device, e.g., a hardware shield device, may include a shield can including an opening through which at least a part of a device element is exposed, a heat dissipation module of which at least a part is mounted on the opening, a cover member connected to one surface of the heat dissipation module, and a conductor arranged between the shield can and the cover member, the conductor surrounding at least a part of a gap between the opening and the heat dissipation module.

According to an embodiment, the device may include at least one of one or more adhesive layers arranged on at least one of upper and lower surfaces of the conductor so as to be bonded to at least one of the shield can and the cover member, an open hole formed in at least a part of a center of the conductor so as to correspond to the opening, and an adhesive layer arranged on a side wall forming the open hole so as to be bonded to the heat dissipation module.

Figure 7:
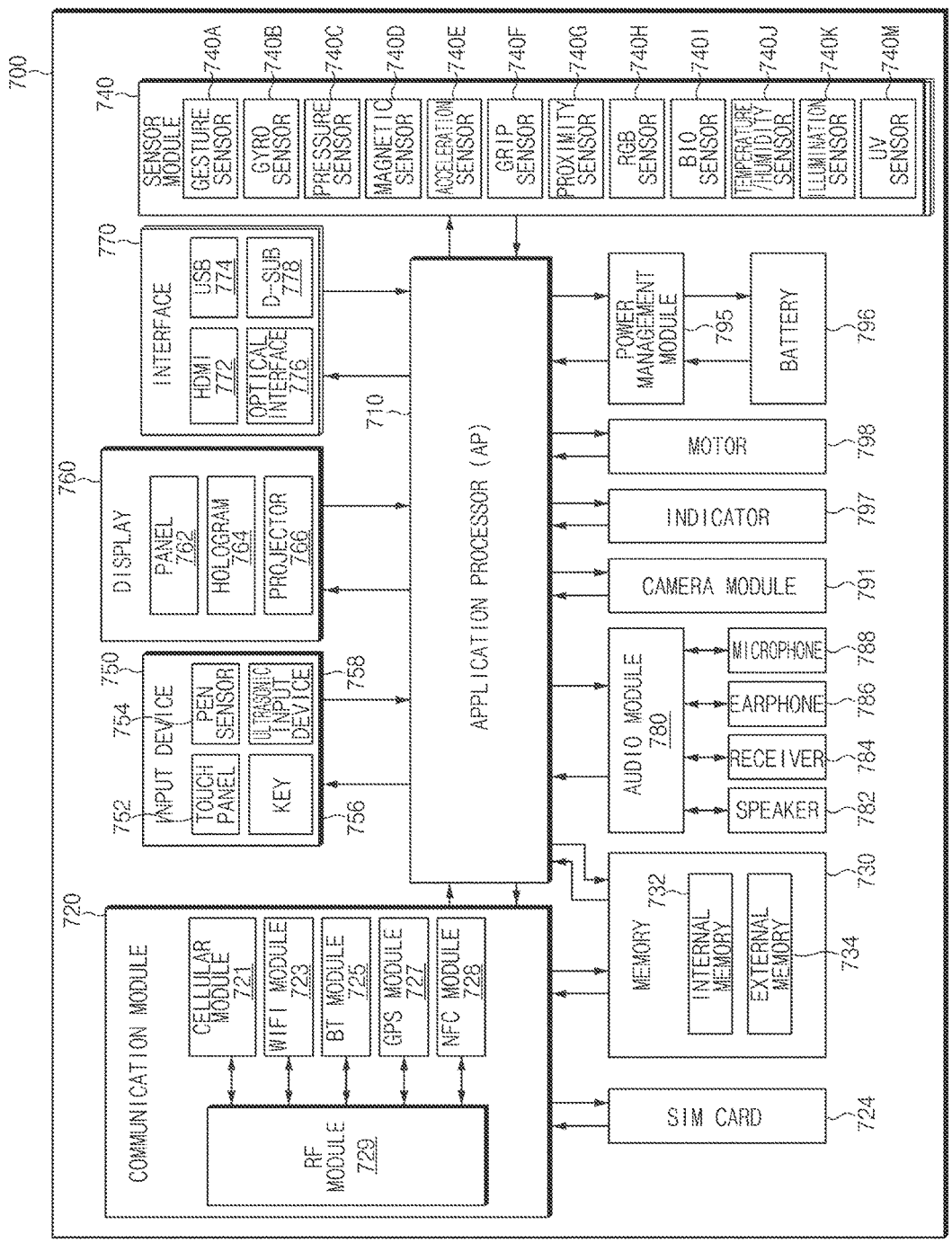
FIG. 7 is a block diagram illustrating a hardware structure of an electronic device according to an embodiment of the present disclosure.

FIG. 7 is a block diagram illustrating a hardware structure of an electronic device according to an embodiment of the present disclosure.

Referring to FIG. 7, an electronic device 700 may include at least one of one or more APs 710, which may be similar to the device element 170 and/or the AP 171, a communication module 720, a subscriber identification module (SIM) card 724, a memory 730, a sensor module 740, an input device 750, a display 760, an interface 770, an audio module 780, a camera module 791, a power management module 795, a battery 796, an indicator 797 and a motor 798.

The AP 710 may run an operating system and/or an application program so as to control a plurality of hardware and/or software elements connected to the AP 710, and may process various data including multimedia data and may perform an operation thereon. The AP 710 may be implemented with, for example, a system on chip (SoC). According to an embodiment, the AP 710 may further include a graphic processing unit (GPU) (not illustrated).

The AP 710 may be arranged inside the hardware shield device 100 described above. Furthermore, the AP 710 may be exposed to the outside through the opening 111 formed in the shield can 110 of the hardware shield device 100. The AP 710 exposed through the opening 111 may contact with the heat dissipation module 120. The conductor 130, which may include the conductive gaskets 130a and 130b and/or the conductive clip 130c, may be arranged on an edge region of the opening 111 that exposes the AP 710. According to the structure of the electronic device 700, a portion that is arranged between the cover member 140 on the conductor 130 and the shield can 110 so that at least a part of the AP 710 is exposed through the opening 111 may be closed. Therefore, the electronic device 700 may shield noise generated from the AP 710.

The communication module 720 may perform data transmission/reception for communication between the electronic device 700 and other electronic devices connected thereto through a network. According to an embodiment, the communication module 720 may include a cellular module 721, a Wi-Fi module 723, a Bluetooth (BT) module 725, a GPS module 727, a near field communication (NFC) module 728, and a radio frequency (RF) module 729.

The cellular module 721 may provide a voice call service, a video call service, a text message service, or an Internet service through a telecommunications network, e.g., long term evolution (LTE), LTE-advanced (LTE-A), code division multiple access (CDMA), wideband CDMA (WCDMA), universal mobile telecommunication system (UMTS), wireless broadband (WiBro), and global system for mobile communications (GSM) networks. Furthermore, the cellular module 721 may identify and authenticate electronic devices in the telecommunications network using, for example, a subscriber identification module, e.g., the SIM card 724. According to an embodiment, the cellular module 721 may perform at least a part of functions provided by the AP 710. For example, the cellular module 721 may perform at least a part of a multimedia control function.

According to an embodiment, the cellular module 721 may include a communication processor (CP) (not shown). The cellular module 721 may be implemented with, for example, a SoC. Although FIG. 7 illustrates that the cellular module 721, e.g., a CP, the memory 730 and the power management module 795 are separated from the AP 710, the AP 710 may include at least a part of the foregoing elements according to an embodiment.

According to an embodiment, the AP 710 or the cellular module 721 may load, on a volatile memory, a command and/or data received from at least one of a nonvolatile memory and/or other elements connected to the AP 710 and/or the cellular module 721, so as to process the command and/or data. Furthermore, the AP 710 and/or the cellular module 721 may store, in the nonvolatile memory, data received from and/or generated by at least one of the other elements.

Each of the Wi-Fi module 723, the BT module 725, the GPS module 727 and the NFC module 728 may include, for example, a processor (not shown) for processing data transmitted/received through the modules. FIG. 7 illustrates the cellular module 721, the Wi-Fi module 723, the BT module 725, the GPS module 727 and the NFC module 728 as if the modules are separate blocks. However, according to an embodiment, at least a part, e.g., two or more, of the cellular module 721, the Wi-Fi module 723, the BT module 725, the GPS module 727 and the NFC module 728 may be included in a single integrated chip (IC) or IC package. For example, at least a part of processors corresponding to the cellular module 721, the Wi-Fi module 723, the BT module 725, the GPS module 727 and the NFC module 728 respectively, e.g., a communication processor corresponding to the cellular module 721 and a Wi-Fi processor corresponding to the Wi-Fi module 723, may be implemented with a single SoC.

The RF module 729 may transmit/receive data, for example, may transmit/receive RF signals. Although not illustrated, for example, a transceiver, a power amp module (PAM), a frequency filter and/or a low noise amplifier (LNA) may be included in the RF module 729. Furthermore, the RF module 729 may further include a component such as a conductor and/or a wire for transmitting/receiving free-space electromagnetic waves in a wireless communication system. FIG. 7 illustrates the cellular module 721, the Wi-Fi module 723, the BT module 725, the GPS module 727 and the NFC module 728 as if the modules share the single RF module 729. However, according to an embodiment, at least one of the cellular module 721, the Wi-Fi module 723, the BT module 725, the GPS module 727 or the NFC module 728 may transmit/receive RF signals through an additional RF module (not shown).

The SIM card 724 may include a SIM, and may be inserted into a slot formed at a specific location of the electronic device 700. The SIM card 724 may include unique identification information, e.g., an integrated circuit card identifier (ICCID), and/or subscriber information, e.g., international mobile subscriber identity (IMSI).

The memory 730 may include an internal memory 732 and/or an external memory 734. The internal memory 732 may include, although not shown, at least one of a volatile memory, e.g., a random access memory (RAM), a dynamic RAM (DRAM), a static RAM (SRAM) and/or a synchronous dynamic RAM (SDRAM)), and/or a nonvolatile memory, e.g., a read only memory (ROM), a one-time programmable ROM (OTPROM), a programmable ROM (PROM), an erasable and programmable ROM (EPROM), an electrically erasable and programmable ROM (EEPROM), a mask ROM, a flash ROM, a NAND flash memory, and/or a NOR flash memory.

According to an embodiment, the internal memory 732 may be a solid state drive (SSD). The external memory 734 may include a flash drive, for example, compact flash (CF), secure digital (SD), micro secure digital (Micro-SD), mini secure digital (Mini-SD), extreme digital (xD) and/or a memory stick. The external memory 734 may be functionally connected to the electronic device 700 through various interfaces. According to an embodiment, the electronic device 700 may further include a storage device and/or a storage medium, such as a hard drive.

The sensor module 740 may measure physical quantity and/or detect an operation state of the electronic device 700 so as to convert measured and/or detected information into an electrical signal. The sensor module 740 may include, for example, at least one of a gesture sensor 740A, a gyro sensor 740B, an atmospheric pressure sensor 740C, a magnetic sensor 740D, an acceleration sensor 740E, e.g., an accelerometer, a grip sensor 740F, a proximity sensor 740G, a Red Green Blue (RGB) sensor 740H, a biometric (BIO) sensor 740I, a temperature/humidity sensor 740J, an illumination sensor 740K and/or an ultraviolet (UV) sensor 740M. Although not illustrated, additionally or alternatively, the sensor module 740 may include, for example, an olfactory sensor, such as an E-nose sensor, an electromyography (EMG) sensor, an electroencephalogram (EEG) sensor, an electrocardiogram (ECG) sensor, a photoplethysmography (PPG) sensor, an infrared (IR) sensor, an iris recognition sensor, and/or a fingerprint sensor. The sensor module 740 may further include a control circuit for controlling at least one sensor included therein.

The input device 750 may include a touch panel 752, a pen sensor 754, which may be a digital pen sensor, a key 756, and/or an ultrasonic input device 758. The touch panel 752 may recognize a touch input using at least one of capacitive, resistive, infrared and ultraviolet sensing methods. The touch panel 752 may further include a control circuit (not shown). In the case of using the capacitive sensing method, a physical contact recognition and/or proximity recognition is allowed. The touch panel 752 may further include a tactile layer. In this case, the touch panel 752 may provide tactile reaction to a user.

The pen sensor 754 may be implemented in a similar or same manner as the method of receiving a touch input of a user and/or may be implemented using an additional sheet for recognition. The key 756 may include, for example, although not shown, a physical button, an optical button, and/or a keypad. The ultrasonic input device 758, which is an input device for generating an ultrasonic signal, may enable the electronic device 700 to sense a sound wave through a microphone, e.g., a microphone 788, so as to identify data, wherein the ultrasonic input device 758 is capable of wireless recognition. According to an embodiment, the electronic device 700 may use the communication module 720 so as to receive a user input from an external device, e.g., a computer and/or a server, connected to the communication module 720.

The display 760 may include a panel 762, a hologram device 764, and/or a projector 766. The panel 762 may be, for example, a liquid crystal display (LCD) and/or an active-matrix organic light-emitting diode (AM-OLED). The panel 762 may be, for example, flexible, transparent and/or wearable. The panel 762 and the touch panel 752 may be integrated into a single module. The hologram device 764 may display a stereoscopic image in a space using a light interference phenomenon. The projector 766 may project light onto a screen so as to display an image. The screen may be arranged in the inside or the outside of the electronic device 700. According to an embodiment, the display 760 may further include a control circuit (not shown) for controlling the panel 762, the hologram device 764, or the projector 766.

The interface 770 may include, for example, a high definition multimedia interface (HDMI) 772, a universal serial bus (USB) 774, an optical interface 776, and/or a D-subminiature (D-sub) 778. Additionally or alternatively, the interface 770 may include, for example, although not shown, a mobile high-definition link (MHL) interface, a secure digital (SD) card/multi-media card (MMC) interface, and/or an infrared data association (IrDA) interface.

The audio module 780 may convert a sound into an electrical signal and/or vice versa. The audio module 780 may process sound information input and/or output through a speaker 782, a receiver 784, an earphone 786, and/or the microphone 788.

According to an embodiment, the camera module 791 for shooting a still image and/or a video may include at least one image sensor (not shown), (e.g., a front sensor and/or a rear sensor, a lens (not shown), an image signal processor (ISP) (not shown), and/or a flash, e.g., a light emitting diode (LED) and/or a xenon lamp (not shown).

The power management module 795 may manage power of the electronic device 700. Although not illustrated, a power management integrated circuit (PMIC), a charger integrated circuit (IC), a battery gauge, and/or fuel gauge may be included in the power management module 795.

The PMIC may be mounted on an integrated circuit or an SoC semiconductor. A charging method may be classified into a wired charging method and a wireless charging method. The charger IC may charge a battery, and may prevent an overvoltage or an overcurrent from being introduced from a charger. According to an embodiment, the charger IC may include a charger IC for at least one of the wired charging method and the wireless charging method. The wireless charging method may include, for example, a magnetic resonance method, a magnetic induction method and/or an electromagnetic method, and may include an additional circuit (not shown), for example, a coil loop, a resonant circuit, and/or a rectifier.

The battery gauge may measure, for example, a remaining capacity of the battery 796 and a voltage, current and/or temperature thereof while the battery is charged. The battery 796 may store and/or generate electricity, and may supply power to the electronic device 700 using the stored or generated electricity. The battery 796 may include, for example, a rechargeable battery and/or a solar battery.

The indicator 797 may indicate a specific state of the electronic device 700 and/or a part thereof, e.g., the AP 710, such as a booting state, a message state, and/or a charging state. The motor 798 may convert an electrical signal into a mechanical vibration. Although not illustrated, a processing device, e.g., a GPU, for supporting a mobile TV may be included in the electronic device 700. The processing device for supporting a mobile TV may process media data according to the standards of digital multimedia broadcasting (DMB), digital video broadcasting (DVB) and/or media flow.

As described above, according to an embodiment, an electronic device may include a printed circuit board, an electronic chip arranged on the printed circuit board, a shield can including an opening through which at least a part of the electronic chip is exposed, a heat dissipation module of which at least a part is mounted on the opening or the periphery of the opening, a cover member connected to one surface of the heat dissipation module, and a conductor surrounding the opening and the periphery of the heat dissipation module.

According to an embodiment, the conductor may include at least one adhesive layer bonded to at least one of the shield can, the cover member or the heat dissipation module.

According to an embodiment, the conductor may include an open hole not greater than the opening.

According to an embodiment, the conductor may include at least one clip arranged at the periphery of the opening.

According to an embodiment, the conductor may be elastic.

According to an embodiment, the conductor may be arranged between the shield can and the cover member so as to surround the opening and the periphery of the heat dissipation module.

According to an embodiment, the heat dissipation module may be such arranged that the heat dissipation module may contact with the device element arranged in the shield can at a surface of the opening, and/or at least a part of the heat dissipation module may be arranged inside the opening so that the heat dissipation module may contact with the device element arranged in the shield can.

According to an embodiment, the heat dissipation module may be integrated with the cover member.

Each of the above-mentioned elements of the electronic device according to an embodiment of the present disclosure may be configured with one or more components, and the names of the elements may be changed according to the type of the electronic device. The electronic device according to an embodiment of the present disclosure may include at least one of the above-mentioned elements, and some elements may be omitted and/or other additional elements may be added. Furthermore, some of the elements of the electronic device according to an embodiment of the present disclosure may be combined with each other so as to form one entity, so that the functions of the elements may be performed in the same manner as before the combination.

The term "module" used herein may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" according to the various embodiments of the present disclosure may include at least one of an application-specific integrated circuit (ASIC) chip, a field-programmable gate array (FPGA), and/or a programmable-logic device for performing some operations, which are known or will be developed.

According to an embodiment, in a hardware shield device and/or an electronic device including the same, a device having a heat dissipation function and a noise shielding function is arranged on a device element that generates heat, so that both the heat dissipation effect and the noise shielding effect may be achieved.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A device comprising:
a shield can including an opening through which at least a part of a device element is exposed;
a heat dissipation element including at least a part that faces the part of the device element exposed through the opening;
a cover member connected to a topmost surface of the heat dissipation element; and
a conductor arranged between the shield can and the cover member, the conductor surrounding the opening and at least a part of a periphery of the heat dissipation element,
wherein the conductor includes an open hole corresponding to the opening, and
wherein a size of the open hole is smaller than a size of the opening.

2. The device according to claim 1, wherein the conductor includes at least one adhesive layer bonded to at least one of the shield can or the cover member.

3. The device according to claim 1, wherein the conductor includes an adhesive layer formed on a side wall forming the open hole, the adhesive layer being bonded to the heat dissipation element.

4. The device according to claim 1, wherein the conductor is formed by at least one clip arranged at a periphery of the opening.

5. The device according to claim 1, wherein the conductor is elastic.

6. The device according to claim 1, wherein the conductor is formed to correspond to an overall shape of the shield can.

7. The device according to claim 1, wherein the heat dissipation element is integrated with the cover member.

8. The device according to claim 7, wherein the heat dissipation element contacts the device element arranged in the shield can at a surface of the opening.

9. The device according to claim 7, wherein at least a part of the heat dissipation element is arranged inside the opening so that the heat dissipation element contacts the device element arranged in the shield can.

10. The device according to claim 1, wherein the heat dissipation element is a thermal interface material (TIM) tape.

11. An electronic device comprising:
a printed circuit board;
an electronic chip arranged on the printed circuit board;
a shield can including an opening through which at least a part of the electronic chip is exposed;
a heat dissipation element including at least a part that faces the part of the electronic chip exposed through the opening or on a periphery of the opening;
a cover member connected to a topmost surface of the heat dissipation element; and
a conductor surrounding the opening and a periphery of the heat dissipation element,
wherein the conductor includes an open hole formed in at least a part of a center of the conductor so as to correspond to the opening, and wherein a size of the open hole is smaller than a size of the opening.

12. The electronic device according to claim 11, wherein the conductor includes at least one adhesive layer bonded to at least one of the shield can, the cover member and the heat dissipation element.

13. The electronic device according to claim 12, wherein the conductor is formed by at least one clip arranged at the periphery of the opening.

14. The electronic device according to claim 12, wherein the conductor is elastic.

15. The electronic device according to claim 12, wherein the conductor is arranged between the shield can and the cover member so as to surround both the opening and the periphery of the heat dissipation element.

16. The electronic device according to claim 11, wherein the heat dissipation element is a thermal interface material (TIM) tape.

17. The electronic device according to claim 11, wherein the heat dissipation element is arranged so that the heat dissipation element contacts with the device element arranged in the shield can at a surface of the opening, or so that at least a part of the heat dissipation element is arranged inside the opening so that the heat dissipation element contacts with the device element arranged in the shield can.

18. A device comprising:
   a shield can including an opening through which at least a part of a device element is exposed;
   a heat dissipation element including at least a part that faces the part of the device element exposed through the opening;
   a cover member connected to a topmost surface of the heat dissipation element; and
   a conductor arranged between the shield can and the cover member, the conductor surrounding at least a part of a gap between a peripheral region of the opening and a peripheral region of the heat dissipation element,
   wherein the conductor includes an open hole formed in at least a part of a center of the conductor so as to correspond to the opening, and
   wherein a size of the open hole is smaller than a size of the opening.

19. The device according to claim 18, further comprising at least one of:
   one or more adhesive layers arranged on at least one of an upper surface or a lower surface of the conductor so as to be bonded to at least one of the shield can and the cover member; or
   an adhesive layer arranged on a side wall forming the open hole so as to be bonded to the heat dissipation element.

20. The device according to claim 18, wherein the heat dissipation element is a thermal interface material (TIM) tape.

* * * * *